(12) United States Patent
Ogata et al.

(10) Patent No.: US 8,169,323 B2
(45) Date of Patent: May 1, 2012

(54) NONCONTACT IC TAG LABEL, AIRLINE BAGGAGE TAG LABEL, AND MANUFACTURING METHOD FOR NONCONTACT IC TAG LABEL

(75) Inventors: Tetsuji Ogata, Itabashi (JP); Hideto Sakata, Akishima (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 375 days.

(21) Appl. No.: 12/513,398

(22) PCT Filed: Oct. 30, 2007

(86) PCT No.: PCT/JP2007/071087
§ 371 (c)(1),
(2), (4) Date: May 4, 2009

(87) PCT Pub. No.: WO2008/056564
PCT Pub. Date: May 15, 2008

(65) Prior Publication Data
US 2010/0066538 A1    Mar. 18, 2010

(30) Foreign Application Priority Data
Nov. 9, 2006  (JP) .................................. 2006-303578

(51) Int. Cl.
*G08B 13/14* (2006.01)
(52) U.S. Cl. ............... 340/572.8; 340/572.7; 340/572.1; 340/571; 235/489; 257/684
(58) Field of Classification Search ............... 340/572.7, 340/572.8, 572.1, 571; 235/489, 488; 257/679, 257/684
See application file for complete search history.

(56) References Cited

U.S. PATENT DOCUMENTS
7,071,826 B2 *  7/2006  Peterson ..................... 340/572.8
2006/0266410 A1 * 11/2006  Ogita et al. .................. 136/258

FOREIGN PATENT DOCUMENTS
| JP | 07-056513 A1 | 3/1995 |
| JP | 2002-351336 A1 | 12/2002 |
| JP | 2003-162221 A1 | 6/2003 |
| JP | 2003162221 | * 6/2003 |
| JP | 2004-094502 A1 | 3/2004 |
| JP | 2005-346696 A1 | 12/2005 |

OTHER PUBLICATIONS

Japanese Office Action dated Nov. 29, 2011 (in English).

* cited by examiner

*Primary Examiner* — Jennifer Mehmood
*Assistant Examiner* — Hongmin Fan
(74) *Attorney, Agent, or Firm* — Burr & Brown

(57) ABSTRACT

A noncontact IC tag label includes: a band-shaped label base material inclusive of a release surface formed at least at one end of the base material and releasably treated in advance, and a non-release surface; an electroconductive layer formed on the non-release surface of the band-shaped label base material and including a required antenna pattern; and an IC chip mounted on one face of the electroconductive layer. The electroconductive layer and the IC chip are shrouded by a surface protection sheet via a pressure-sensitive adhesive layer. A thermoadhesive resin layer bonded onto the non-release surface of the band-shaped label base material is provided on an opposite face of the electroconductive layer including the antenna pattern, with respect to the surface protection sheet. Also, the pressure-sensitive adhesive layer is bonded onto the non-release surface and release surface of the band-shaped label base material.

12 Claims, 6 Drawing Sheets

NONCONTACT IC TAG LABEL, AIRLINE BAGGAGE TAG LABEL, AND MANUFACTURING METHOD FOR NONCONTACT IC TAG LABEL

CROSS-REFERENCE TO RELATED APPLICATIONS

The present patent application benefits from Japanese application serial number JP2006-303578, filed on Nov. 9, 2006. The entire disclosure of this earlier application is hereby incorporated by reference into the present DESCRIPTION.

FIELD OF THE INVENTION

The present invention relates generally to noncontact IC tag labels, airline baggage tag labels, and methods of manufacturing a noncontact IC tag label. Notably, the invention concerns a method of manufacturing an IC tag label, airline baggage tag label, and noncontact IC tag label freed of a special release paper by assigning a function of a special release paper to part of a base material of a conventional noncontact IC tag label or airline baggage tag label.

In addition, although useable in various applications, the noncontact IC tag label of the present invention can be suitably used as an airline baggage tag label or the like.

BACKGROUND OF THE INVENTION

Noncontact IC tag labels are a medium that is also termed a radio-frequency identification (RFID) tag or a noncontact data carrier. This type of medium has an IC chip retaining the information allowing the identification of one specific product, commodity, article, or the like, and is constructed to allow noncontact reading of the information by means of radio communications. These noncontact IC tag labels are used in such fields as transport, physical distribution, warehousing, factory process control, and airline baggage handling.

The advantages and applicability of the noncontact IC tags are becoming confirmed, but a cause of the hindrance to more widespread use of these noncontact IC tags is the problem that the tags themselves are expensive. For use in larger quantities, therefore, it is important for these tags to be further reduced in cost. Cost reduction of the integrated circuits and base materials required, however, is currently at its limits and thus, remarkable lower pricing of the tags is not anticipated for the nonce. For example, the IC tags used for products are each manufactured by forming a resist pattern on the metallic layer, such as aluminum or copper, that has an antenna or any other electroconductive member for a noncontact IC tag label, stacked primarily upon a base material, and then etching the metallic layer. These IC tags, however, are required to be constructed into a simpler structure and at the same time, manufactured in a simpler manner.

Japanese Laid-Open Patent Application Publication JP-2005-346696A (Patent Document 1) proposes a method of forming an antenna directly by use of a punching edge. However, as the invention disclosed in Patent Document 1 is entitled "Electrically Conductive Member for Noncontact Data Carrier, and Method for Manufacturing the Member", Patent Document 1 does not relate to manufacturing the noncontact IC tag label itself. In addition, although the noncontact data carrier itself is described in claims 3 and 4, a surface protection sheet with a pressure-sensitive adhesive layer is not described and the construction of the noncontact data carrier differs from that of the noncontact IC tag described in the present application.

Documents such as JP-H07-56513A (Patent Document 2) and JP-2002-351336A (Patent Document 3) introduce hand baggage tags. Although JP-H07-56513A describes a hand baggage tag whose base material has thermal adhesiveness, the hand baggage tag does not have an information-recording IC chip, so the corresponding invention has no relationship to the subject matter of the present application. Although JP-2002-351336A also describes an airline baggage tag, since a data storage element is affixed to the base material of the tag, the structure or configuration of the tag differs from those of the noncontact IC tag label or such of the present application. In addition, manufacturing costs cannot be reduced since the conventional tag employs etching as its manufacturing method.

SUMMARY OF THE INVENTION

Conventional noncontact IC tag labels and airline baggage tag labels have had the problem that since a pressure-sensitive adhesive layer is formed on the lower face of an antenna-supporting base film, a release paper for protecting the pressure-sensitive adhesive layer is required separately and this increases the cost of the data carrier. The label described in the present application is of the simpler construction reducing the materials cost of the label. In addition, conventional methods of manufacturing noncontact IC tag labels and/or airline baggage tag labels have had the problems of production rate limits and increased materials costs and manufacturing costs since adoption of an etching process requires the use of resist pattern printing equipment and etching equipment, and the execution of etching-associated post-processing is necessary as well as etching, and furthermore adoption of photomasking requires the use of plate-making equipment and the formation of an independent pattern for each product.

The foregoing JP-2005-346696A only describes a method of manufacturing an electroconductive member for a noncontact IC tag label and does not propose a succession of consistent steps from mounting an IC chip to stacking a surface protection sheet fitted with a pressure-sensitive adhesive layer, over the IC chip. Accordingly, the present applicant researched a lower-cost noncontact IC tag label or airline baggage tag label and methods of manufacturing these labels, completing the present invention.

A first aspect of the present invention which solves the above problems exists in a noncontact IC tag label, comprising: a band-shaped label base material that includes a release surface formed at least at one end of the base material, the release surface being releasably pretreated, and a non-release surface; an electroconductive layer formed on the non-release surface of the band-shaped label base material, the electroconductive layer including a required antenna pattern; an IC chip mounted on one face of the electroconductive layer; and a surface protection sheet for shrouding the electroconductive layer and the IC chip via a pressure-sensitive adhesive layer, wherein a thermoadhesive resin layer bonded onto the non-release surface of the band-shaped label base material is provided on an opposite face of the electroconductive layer including the antenna pattern, with respect to the surface protection sheet, and the pressure-sensitive adhesive layer provided on the surface protection sheet is bonded onto the non-release surface and the release surface of the band-shaped label base material.

In the above noncontact IC tag label, a cutting line or half-cutting line for zoning the band-shaped label base material into a section inclusive of the non-release surface and a section inclusive of the release surface is formed at one end of the band-shaped label base material, and the section of the band-shaped label base material, the section including the non-release surface, is detachable and removable from the section inclusive of the release surface. In this way, the label is constructed to be more easily useable for various purposes. Also, the surface protection sheet is formed from heat-sensitive color-developing paper, so that printing/recording on the surface of the label becomes easier. Additionally, the antenna pattern may be made adaptable to various applications so as to be of either a spiral coil type, a dipole type, or a patch type.

A second aspect of the present invention which solves the above problems exists in an airline baggage tag label, comprising: a band-shaped label base material that includes a release surface formed at least at one end of the base material, the release surface being releasably pretreated, and a non-release surface; an electroconductive layer formed on the non-release surface of the band-shaped label base material, the electroconductive layer including a UHF-band or 2.45-GHz-band dipole antenna; an IC chip mounted on one face of the electroconductive layer; and a surface protection sheet for shrouding the electroconductive layer and the IC chip via a pressure-sensitive adhesive layer, wherein a thermoadhesive resin layer bonded onto the non-release surface of the band-shaped label base material is provided on an opposite face of the electroconductive layer including the antenna pattern, with respect to the surface protection sheet, and the pressure-sensitive adhesive layer provided on the surface protection sheet is bonded onto the non-release surface and the release surface of the band-shaped label base material.

In the above airline baggage tag label, a cutting line or half-cutting line for zoning the band-shaped label base material into a section inclusive of the non-release surface and a section inclusive of the release surface is formed at one end of the band-shaped label base material, and the section of the band-shaped label base material, the section including the non-release surface, is detachable and removable from the section inclusive of the release surface. In this way, the airline baggage tag label is constructed to be suitably useable.

A third aspect of the present invention which solves the above problems exists in a method of manufacturing a noncontact IC tag label, the method comprising the steps of: setting up into position a band-shaped label base material having a release surface formed at least at one end of the base material, the release surface being releasably pretreated, and a non-release surface; bringing an antenna material inclusive of an electroconductive layer and a thermoadhesive resin layer into firm contact with the non-release surface of the band-shaped label base material so that the thermoadhesive resin layer comes into contact with the non-release surface; die-cutting the electroconductive layer and thermoadhesive resin layer of the antenna material into a shape of an antenna pattern, from a side the electroconductive layer is disposed down to the non-release surface, by means of an antenna-cutting die with a heat source, while at the same time, bonding the thermoadhesive resin layer onto the non-release surface by fusing the thermoadhesive resin layer; removing a section of the die-cut antenna material, the section excluding the antenna pattern; mounting an IC chip at a required position on the antenna pattern; and stacking a surface protection sheet over the antenna pattern, the IC chip, and the non-release surface and release surface of the band-shaped label base material, by use of a pressure-sensitive adhesive agent.

A fourth aspect of the present invention which solves the above problems exists in a method of manufacturing a noncontact IC tag label, the method comprising the steps of: setting up into position a band-shaped label base material having a releasably treated release surface; forming a non-release surface by polishing a part of the band-shaped label base material, the part becoming an antenna-forming section; bringing an antenna material inclusive of an electroconductive layer and a thermoadhesive resin layer into firm contact with the non-release surface formed by the polishing operation, in order for the thermoadhesive resin layer to come into contact with the non-release surface; die-cutting the electroconductive layer and thermoadhesive resin layer of the antenna material into a shape of an antenna pattern, from a side the electroconductive layer is disposed down to the non-release surface, by means of an antenna-cutting die with a heat source, while at the same time, bonding the thermoadhesive resin layer onto the non-release surface by fusing the thermoadhesive resin layer; removing a section of the die-cut antenna material, the section excluding the antenna pattern; mounting an IC chip at a required position on the antenna pattern; and stacking a surface protection sheet over the antenna pattern, the IC chip, and the non-release surface and release surface of the band-shaped label base material, by use of a pressure-sensitive adhesive agent.

In the above method of manufacturing a noncontact IC tag label, the antenna pattern may be made adaptable to various applications so as to be of either a spiral coil type, a dipole type, or a patch type. In addition, forming the surface protection sheet from heat-sensitive color-developing paper allows easy printing/recording on the surface of the label.

(1) The noncontact IC tag label or airline baggage tag label of the present invention can be reduced in materials cost since the release paper for pressure-sensitive adhesive layer protection, the release paper being a mandatory structural material in conventional tag labels, is not used to form an antenna on a band-shaped label base material.

(2) Since the airline baggage tag label of the present invention includes a UHF-band or 2.45-GHz-band dipole antenna, remote communication is possible and the label can be used for effective handling of airline hand baggage.

(3) In the noncontact IC tag label manufacturing method of the present invention, manufacturing costs can be reduced since die cutting with an antenna-cutting die is used to complete an antenna without using such an etching method as employed in conventional techniques.

BRIEF DESCRIPTION OF THE DRAWINGS

FIG. 1 shows a noncontact IC tag label of the present invention, with FIG. 1A being a plan view of the tag label and FIG. 1B being a sectional view taken along line A-A in FIG. 1A;

DETAILED DESCRIPTION OF THE INVENTION

Hereunder, embodiments of the present invention will be described in further detail referring to the accompanying drawings. While the following describes a noncontact IC tag label of the present invention, an airline baggage tag of the present invention is only limited in terms of applications, and structurally, this tag is substantially the same as the noncontact IC tag label.

Figure 1A:
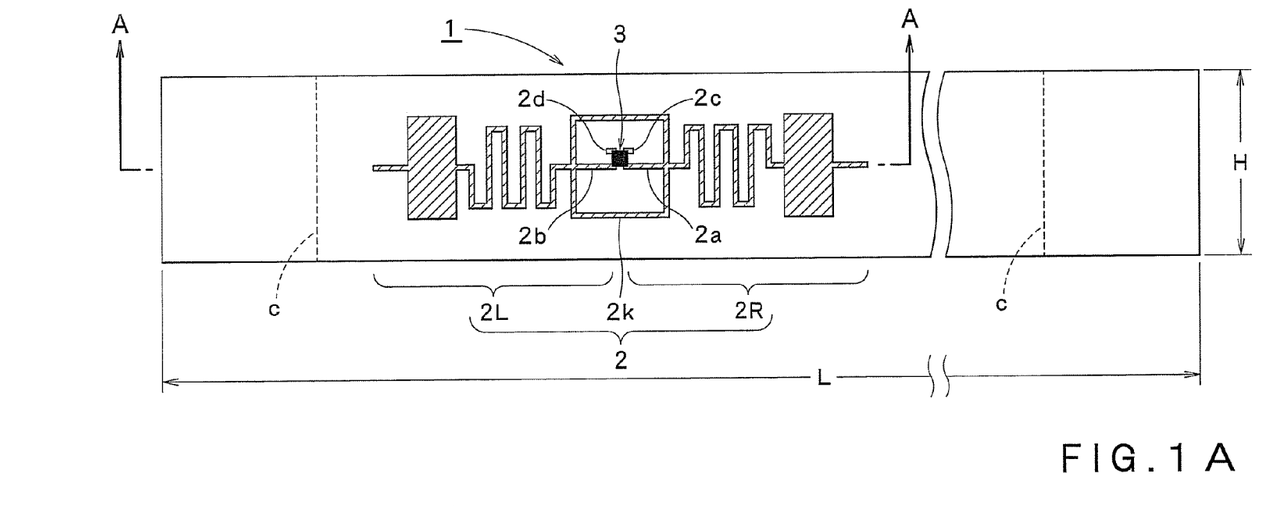
Figure 1B:
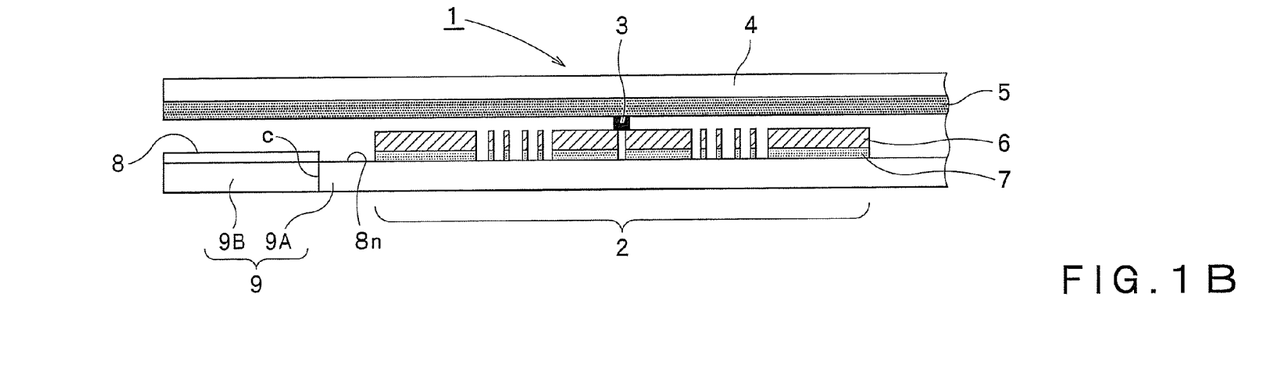
Figure 2:
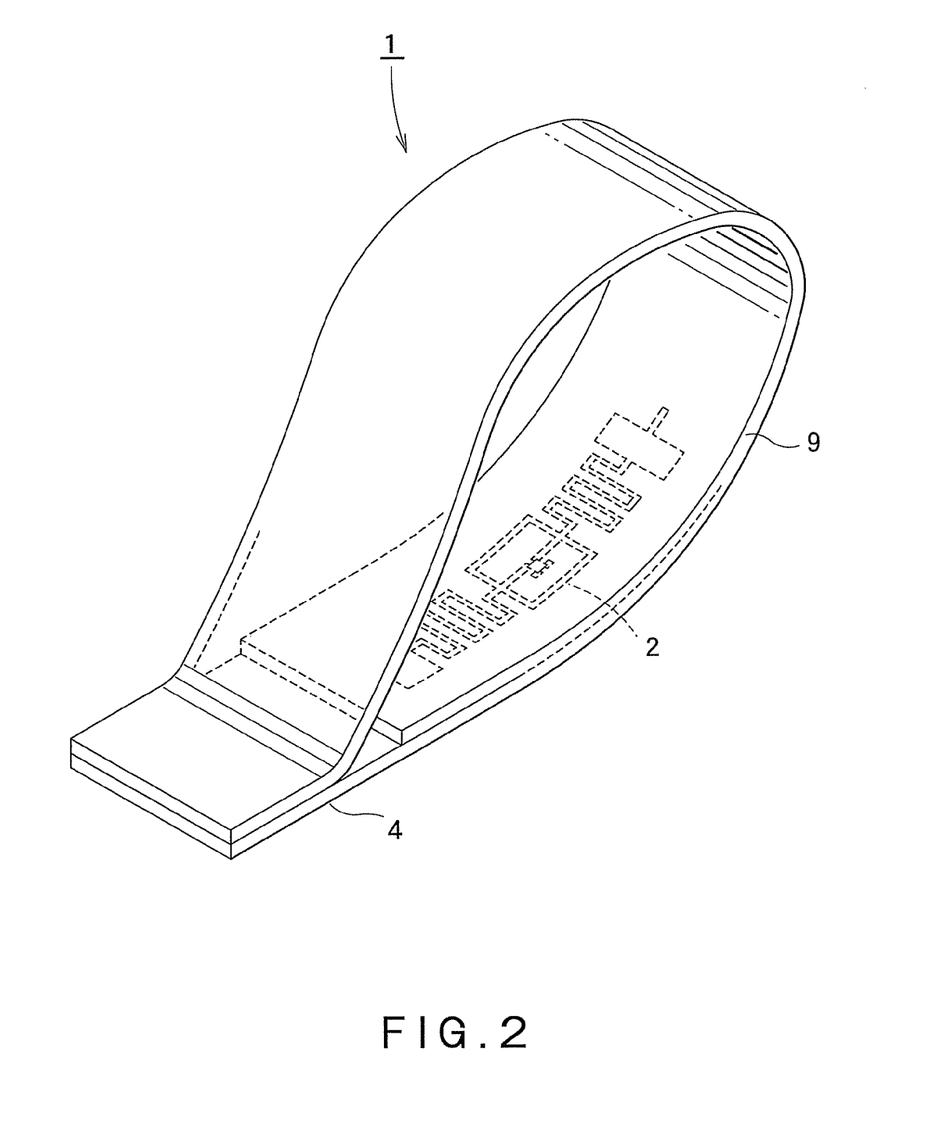
FIG. 2 is a diagram illustrating a method of using the noncontact IC tag label.
Figure 3:
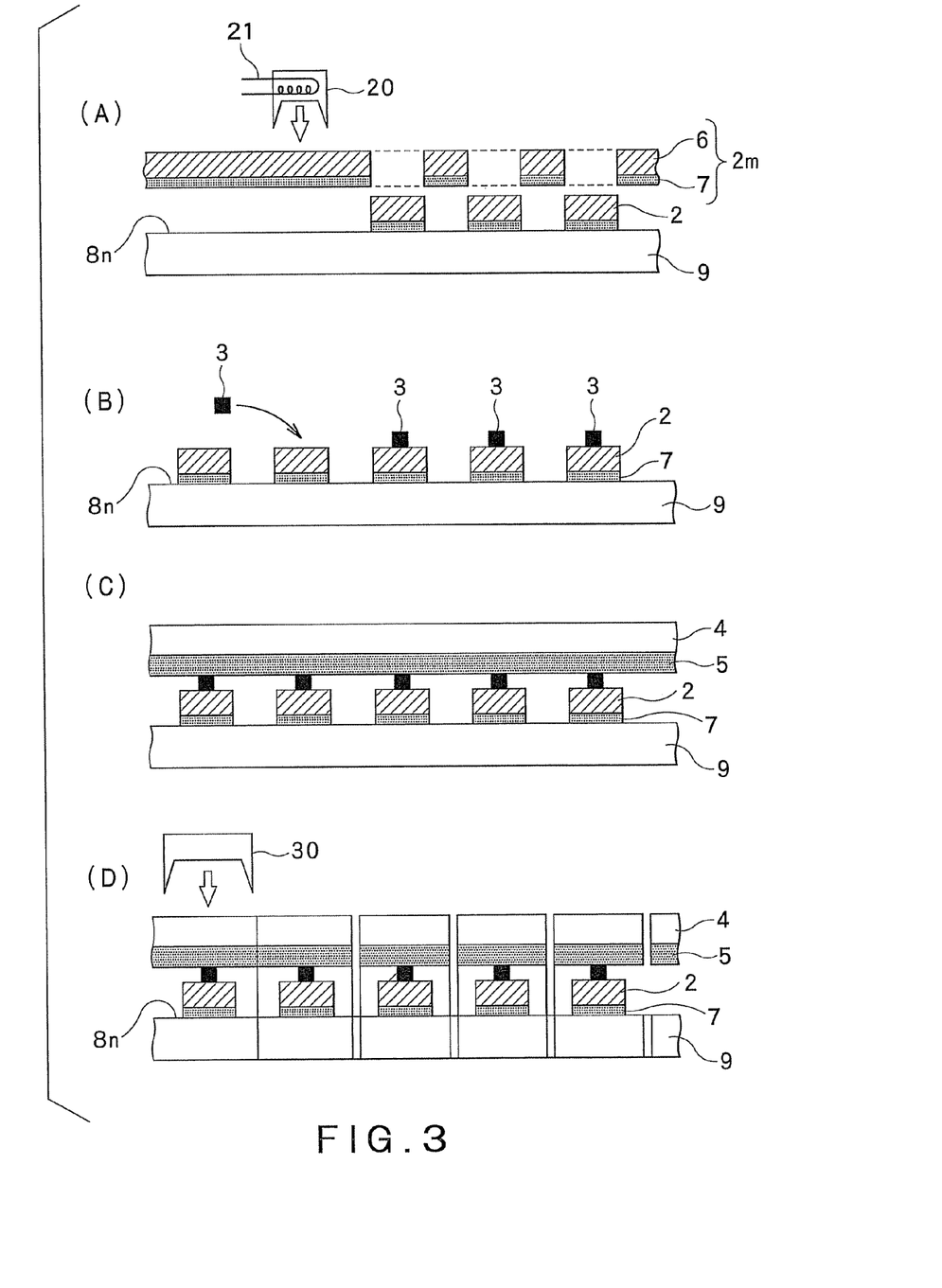
FIG. 3 is a diagram illustrating a first manufacturing process for the noncontact IC tag label.
Figure 4:
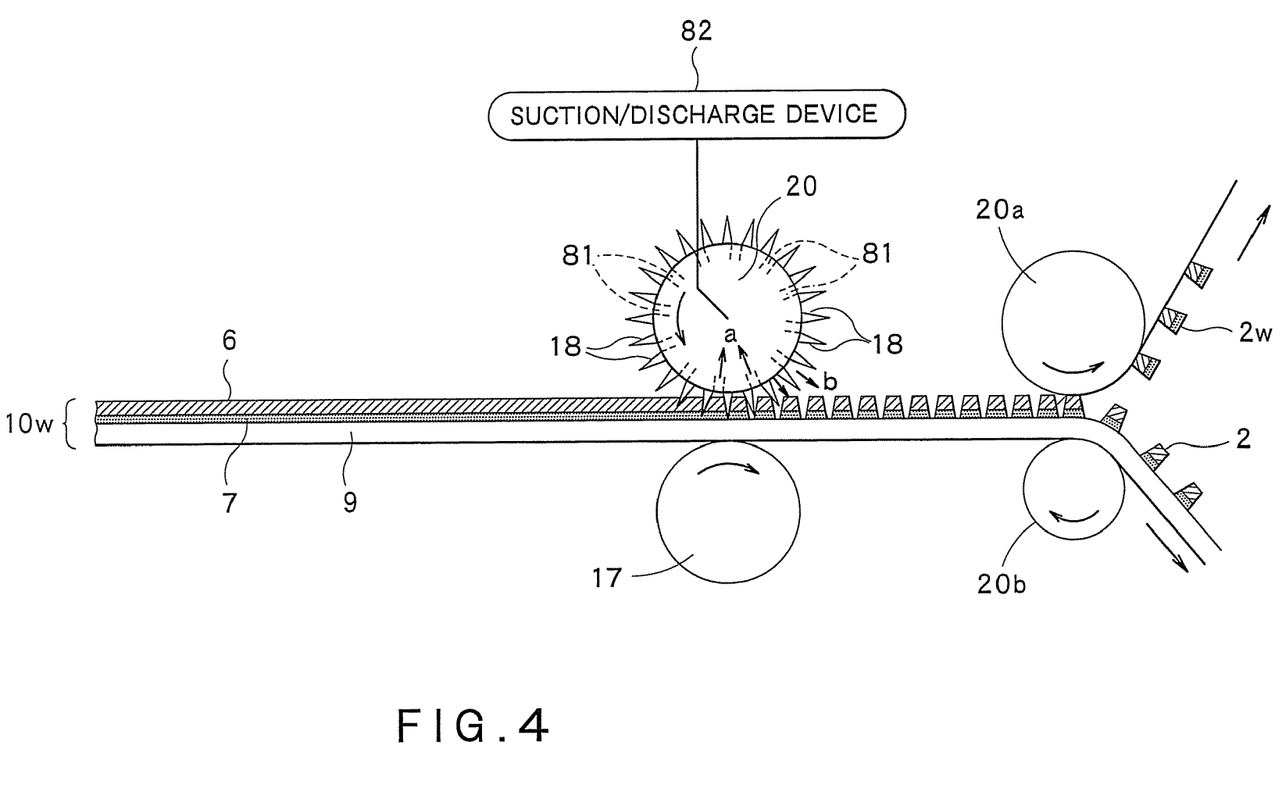
FIG. 4 is a diagram showing a structure of an antenna-punching apparatus.
Figure 5:
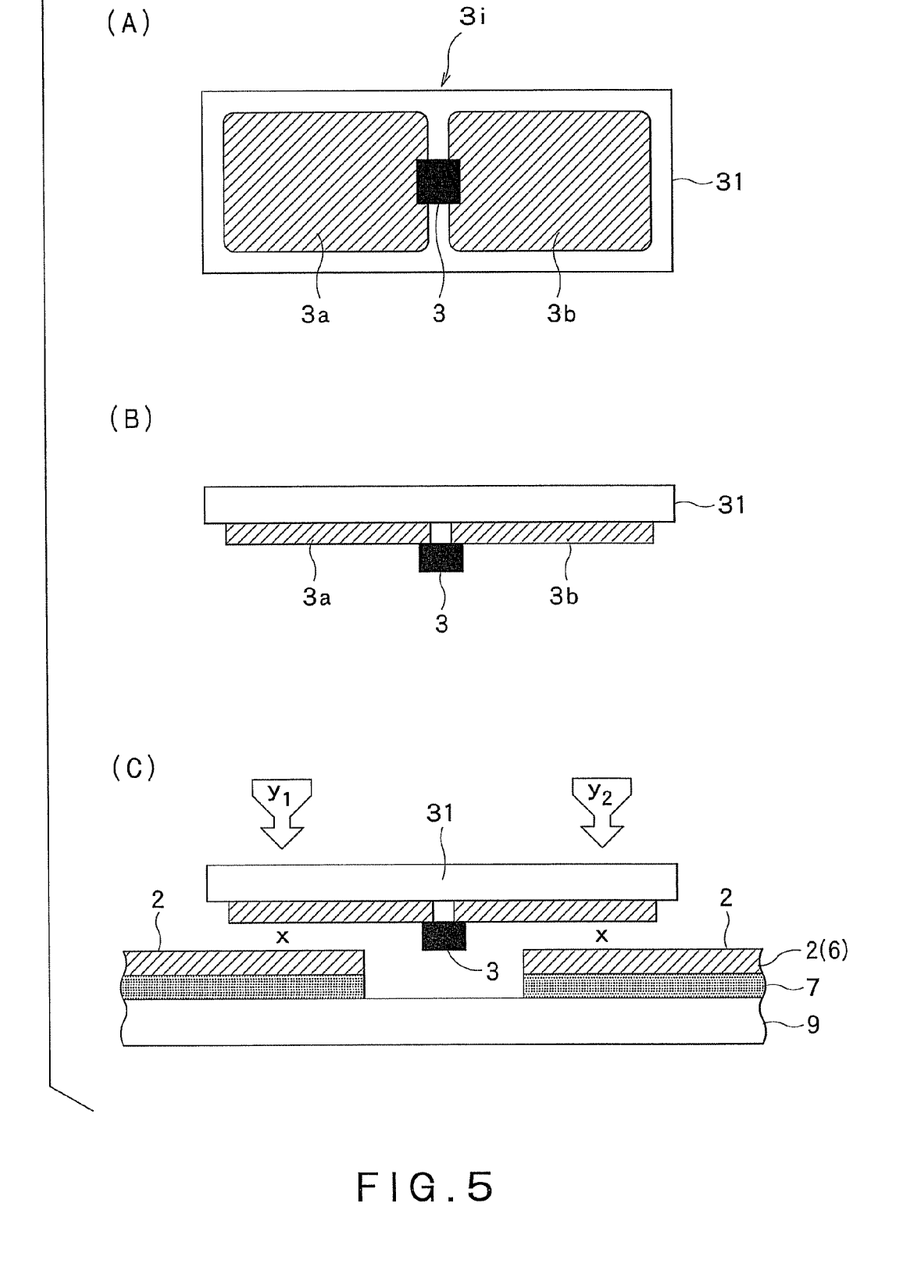
FIG. 5 is a diagram illustrating an example of an interposer.
Figure 6:
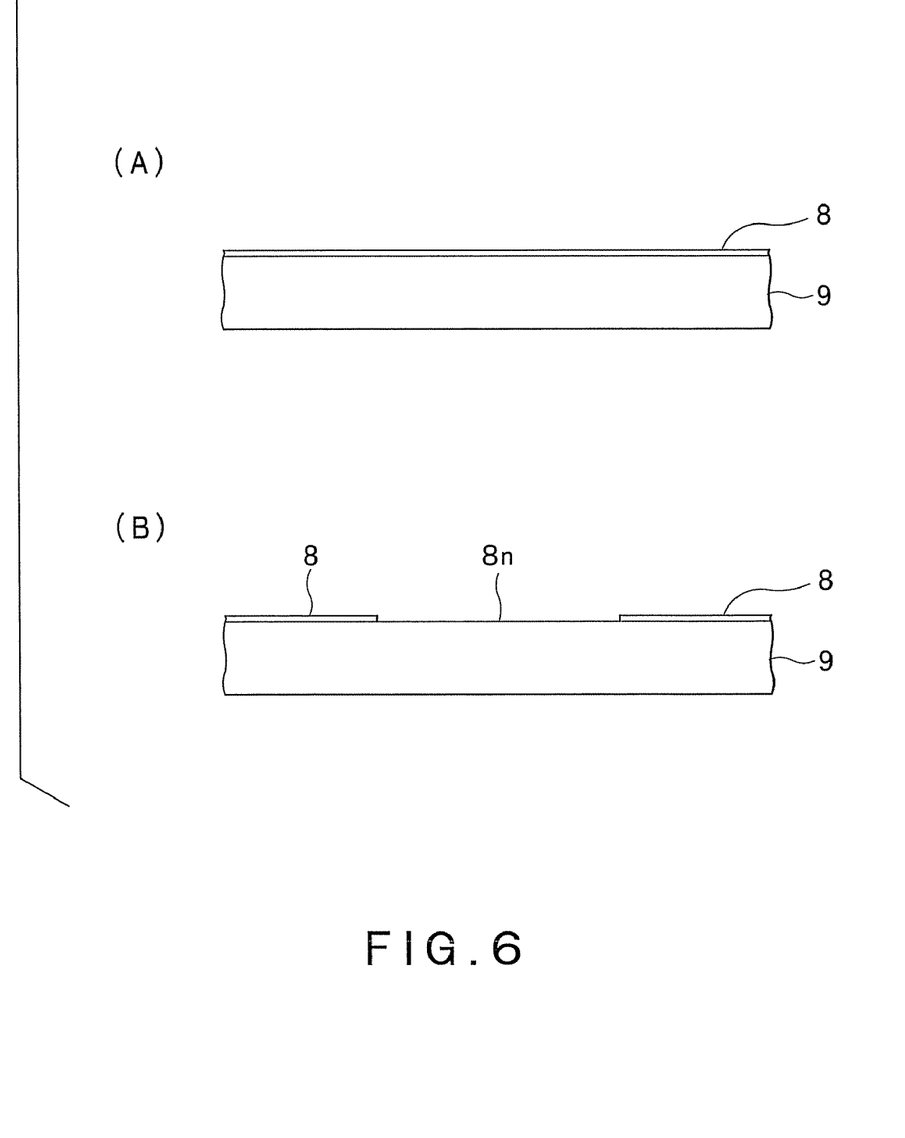
FIG. 6 is a diagram that illustrates part of a second manufacturing process for the noncontact IC tag label.

FIG. 1 is a diagram showing the noncontact IC tag label of the present invention, FIG. 2 is a diagram illustrating a method of using the noncontact IC tag label, and FIG. 3 is a diagram illustrating a first manufacturing process for the noncontact IC tag label. In addition, FIG. 4 is a diagram showing a structure of an antenna-punching apparatus, FIG. 5 is a diagram illustrating an example of an interposer, and FIG. 6 is a diagram that illustrates part of a second manufacturing process for the noncontact IC tag label. Of these figures, only FIG. 1 that shows the noncontact IC tag label of the present invention is divided into FIG. 1A, which is a plan view of the tag label, and FIG. 1B, which is a sectional view taken along line A-A in FIG. 1A.

As shown in FIG. 1A and FIG. 1B, the noncontact IC tag label 1 includes: a band-shaped label base material 9 having a release surface 8 which is formed at least at one end of the base material and releasably pretreated, and having a non-release surface 8n; an electroconductive layer 6 formed on the non-release surface 8n of the band-shaped label base material 9 and including a pattern of a required antenna 2; and an IC chip 3 mounted on one face of the electroconductive layer 6, wherein the electroconductive layer 6 and the IC chip 3 are shrouded by a surface protection sheet 4 via a pressure-sensitive adhesive layer 5, and wherein a thermoadhesive resin layer 7 bonded onto the non-release surface 8n of the band-shaped label base material 9 and having the same shape as that of the antenna pattern is provided on an opposite face of the electroconductive layer 6 including the antenna pattern, with respect to the surface protection sheet 4, and the pressure-sensitive adhesive layer 5 provided on the surface protection sheet 4 is bonded onto the non-release surface 8n and release surface 8 of the band-shaped label base material 9.

FIG. 1A shows a state of the antenna 2 and IC chip 3 existing when viewed through the surface protection sheet 4. As described above, the noncontact IC tag label 1 has the band-shaped label base material 9. The band-shaped label base material 9 has a trifle elongated base material shape suitable for use as a base material of an airline hand baggage label or the like, and usually measures about 200 to 600 mm in length L and about 30 to 80 mm in width H, but is not limited to this geometry. As shown in FIG. 1B, the band-shaped label base material 9 includes the release surface 8 formed at least at one end of the base material and releasably pretreated. However, the releasably pretreated release surface 8 may be formed at both ends of the band-shaped label base material 9. This formation of the release surface 8 also applies to a case in which the release surface 8 is extended to form only the antenna 2 section as the non-release surface 8n. In this case, the non-release surface 8n will be formed by polishing a part of a release paper as described later herein.

The antenna 2 that includes the electroconductive layer 6 and functions as an IC tag, is formed on the non-release surface 8n of the band-shaped label base material 9, and the IC chip 3 is mounted on the antenna 2. Of the band-shaped label base material 9, at least the release surface 8 and the non-release surface 8n corresponding to the antenna 2 are shrouded by the surface protection sheet 4 via the pressure-sensitive adhesive layer 5. The band-shaped label base material 9 may have an entire surface shrouded by the surface protection sheet 4. A cutting line or half-cutting line "c" for zoning the band-shaped label base material 9 into a portion 9A inclusive of the non-release surface 8n and a portion 9B inclusive of the release surface 8 is formed at least at one end of the band-shaped label base material 9. Thus, the portion 9B of the band-shaped label base material 9, the portion 9B including the release surface 8, is detachable and removable from the portion 9A inclusive of the non-release surface 8n. The pressure-sensitive adhesive layer 5 is exposed by peeling off the band-shaped label base material 9 at one end (or both ends) thereof to use the label. The cutting line or half-cutting line "c" includes a perforation line.

As shown in FIG. 1A and FIG. 1B, the surface protection sheet 4 includes, for example, a dipole antenna 2 formed on a back face (inner face) of the sheet. The antenna 2 can take various shapes, including a spiral coil shape, a patch shape, etc. The spiral coil type of antenna that generates electromotive force by electromagnetic induction is usually used for a 13.56-MHz band. Even for the dipole type, the antenna 2, does not need to have the bent shape shown in FIG. 1A, and as a whole, can take a shape adapted to wavelengths of a UHF band or a 2.45-GHz band. In an actual product, the antenna 2 measures about 95 mm in end-to-end distance and about 1 mm in line width, and the IC chip 3 measures about 0.6 mm square.

The antenna 2 has quarter-wavelength antenna portions 2L and 2R. Also, the IC chip 3 is mounted (electrically connected) between connections 2a and 2b on the quarter-wavelength antenna portions 2L, 2R. Additionally, patterns 2c and 2d are provided to stabilize the disposed state of the IC chip 3. These patterns do not connect to the IC chip 3, so the patterns have no electrical significance or meaning. A rectangular circuit 2k surrounding the IC chip 3 is provided as an impedance-matching circuit that matches the antenna 2 and the IC chip 3 in impedance. The IC chip 3 is of a normal type including a data storage region (memory) and having input/output functions, control functions, and signal modulation, demodulation, and control functions. The IC chip 3 can be a single component as shown in FIG. 1A, or can be mounted as an interposer component.

FIG. 1B is a cross-sectional view taken along line A-A in FIG. 1A. The shape of the label in a thickness direction thereof in this cross-sectional view is shown in dimensionally enlarged form. The IC chip 3, although actually present at a slightly shifted position from a transverse central line in FIG. 1A, is shown essentially on the central line. The noncontact IC tag label 1 shown in FIG. 1B is constructed so that the antenna 2 and IC chip 3 located on the back face (inner face) of the surface protection sheet 4 are bonded onto the pressure-sensitive adhesive layer 5. The pressure-sensitive adhesive layer 5 is formed on the entire inner face of the surface protection sheet 4. In FIG. 1B, a clearance appears to be present between the pressure-sensitive adhesive layer 5 and the electroconductive layer 6, but actually, the two layers are in firm contact with each other. At sections without the electroconductive layer 6, the band-shaped label base material 9 and the pressure-sensitive adhesive layer 5 are also in firm contact with each other. This state is also the same as in FIG. 3.

As described above, the antenna 2 includes the electroconductive layer 6, and a thermoadhesive resin layer 7 is provided on a lower face of the electroconductive layer 6. Since the electroconductive layer 6 with the thermoadhesive resin layer 7 is die-cut by using a cutting die to form the antenna 2, both layers are formed into substantially the same shape. An upper surface of the electroconductive layer 6 is in contact with the pressure-sensitive adhesive layer 5, and the thermoadhesive resin layer 7 is bonded onto the band-shaped label base material 9 formed from paper or a plastic. The thermoadhesive resin is an adhesive agent with a so-called hot-melting property, and is a material that, although solid at normal temperature, exhibits adhesiveness when fused by heating or by pressurizing under heat. Although a pressure-sensitive adhesive agent can be used that develops pressure-sensitive adhesion under high pressure, a normal pressure-sensitive adhesive agent that has pressure-sensitive adhesion at normal temperature exhibits pressure-sensitive adhesion to a non-release surface and thus becomes difficult to process. A non-release surface 8n is formed on a face of the band-shaped label base material 9, the face being oriented towards the thermoadhesive resin layer 7. A release surface 8 is formed at one end of or each end of the band-shaped label base material 9. For example, when a base material of the release surface 8 has paper-like quality or is a resin film, the release surface 8 is formed by coating the surface with a silicone-containing resin or any other detachable resin.

The thermoadhesive resin layer 7 is also a material that bonds the electroconductive layer 6 onto the non-release surface 8n of the band-shaped label base material 9. In addition, the surface protection sheet 4 shrouds an entire region or part of the noncontact IC tag label 1 including the antenna 2 and the IC chip 3. When the surface protection sheet 4 shrouds part of the noncontact IC tag label 1, the sheet 4 shrouds at least the section including the antenna 2 and IC chip 3, and a region abutting the release surface 8. In actuality, a large portion of the surface protection sheet 4 region is bonded onto the band-shaped label base material 9 by the pressure-sensitive adhesive layer 5.

In conventional noncontact IC tag labels, a base film for supporting an antenna 2 and an IC chip 3 is provided, and a pressure-sensitive adhesive layer and a release paper are provided on an opposite face of the base film, with respect to the antenna 2. The noncontact IC tag label of the present invention differs in that such a special release paper is not used. An outer surface of the surface protection sheet 4 is preferably provided with various kinds of label printing and/or printing/recording. The surface protection sheet 4 inhibits oxidation of the antenna 2 and the IC chip 3 by preventing both from coming into direct contact with any potentially corrosive gases in an external environment, and protects both from moisture and water.

The surface protection sheet 4 needs only to be a waterproof plastic film or paper. The surface protection sheet 4 can be either of the following materials: polyethylene terephthalate (PET), PET-G (terephthalic acid-cyclohexanedimethanol-ethylene glycol copolymer), polyvinyl chloride, vinyl chloride-vinyl acetate copolymer, polycarbonate, polyamide, polyimide, cellulose diacetate, cellulose triacetate, polystyrene-based, ABS, ester polyacrylate, polypropylene, polyethylene, polyurethane, resin-impregnated paper, coated paper, etc.

Heat-sensitive paper can be used alternatively. Heat-sensitive paper includes a color-developing agent, which allows simplified printing of necessary label-marking information on the noncontact IC tag label 1 by a thermal head. Traditionally, a method of forming an antenna directly on labeling paper may have been adopted, but the use of heat-sensitive paper as the labeling paper has posed the problem that the energy occurring during the formation of the antenna causes the heat-sensitive paper to develop colors. The present invention, however, has an advantage in that since an antenna is formed at the release paper (separator) side, the use of heat-sensitive paper on the surface of the release paper having the antenna formed thereupon does not easily cause fouling.

The electroconductive layer 6 is made of a metallic foil or alloyed foil of aluminum, copper, a copper alloy, phosphor bronze, SUS, or the like. However, an aluminum foil or a copper foil is usually used. Although a foil with a thickness from about 12 µm to about 35 µm is used for a 13.56-MHz band antenna, a foil about 10 to 15 µm thick can be used for a UHF band or a microwave band. This is because, even when the foil is increased in thickness, the skin effect of high-frequency signals will prevent an electric current from flowing through the inside of the metallic layer.

FIG. 2 is a diagram illustrating a method of using the noncontact IC tag label 1. When the noncontact IC tag label 1 is used, the portion 9B including the release surface 8 of the band-shaped label base material 9 is detached and removed from the portion 9A including the non-release surface 8n of the band-shaped label base material 9. At this time, the portion 9B is separated by the cutting line or half-cutting line "c", as shown in FIG. 1A and FIG. 1B. When both ends are detachable, the portions 9B at both ends will be separated, then both ends of the pressure-sensitive adhesive layer 5 exposed will be brought into firm contact with each other to obtain a hoop form, and the label will be mounted on a handle section (or the like) of airline hand baggage. While FIG. 2 applies to using the tag label 1 as an airline baggage tag label, it is self-evident that the label can be used in other various forms by peeling off the portion 9B inclusive of the release surface 8 of the band-shaped label base material 9, and affixing the label to other commodities, products, articles, or the like.

Next, manufacturing processes relating to the noncontact IC tag label of the present invention will be described. A first manufacturing process applies to a case in which, when the band-shaped label base material 9 is not releasably pretreated, only a necessary section of the base material 9 is releasably treated before the label is used. A second manufacturing process applies to a case in which only an antenna-forming section of a release paper which is originally not releasably pretreated is polished to obtain a non-release surface.

FIG. 3 is a diagram illustrating the first manufacturing process for the noncontact IC tag label. FIG. 3 is a sectional view of the noncontact IC tag label as viewed from a longitudinal direction thereof (i.e., a longitudinal direction of an antenna 2). In the first manufacturing process, a continuum of a band-shaped label base material 9 including a releasably pretreated release surface 8 formed at least at one end of the base material 9, and a non-release surface 8n, and made from paper or a plastic, is first set up into position.

Next, a band-shaped antenna material 2m including an electroconductive layer 6 and a thermoadhesive resin layer 7, and the continuum of the band-shaped label base material 9 are supplied in overlapped form to manufacturing line so that the band-shaped antenna material 2m comes into close contact with the non-release surface 8n of the continuum of the band-shaped label base material 9. The close contact here means a state in which the thermoadhesive resin layer 7 of the antenna material 2m and the non-release surface 8n are in contact with each other but are not bonded. While the release surface 8 is formed at one end of or each end of the band-shaped label base material 9, the section where the antenna 2 is formed is the non-release surface 8n. This treatment for partial release can be conducted by applying a band-shaped coat of silicone or any other separable resin by means of gravure printing or the like.

After processing, the band-shaped label base material 9 is cut to the required width H, for which reason the continuum of the band-shaped label base material 9 needs to be a material having a very large value of width L, since, as mentioned above, length L is from 200 to 600 mm, as shown in FIG. 1A and FIG. 1B. Since the band-shaped antenna material 2m is bonded in a definite width region of the band-shaped label base material 9, this base material needs only to be about 100 mm in width, which is substantially the same as overall width of the antenna 2. Supply of the band-shaped label base material 9 to undergo processing, however, is not limited to such a manufacturing method. The band-shaped label base material 9 ranging from about 30 mm to 80 mm in width H can, of course, be supplied for processing. In this case, the band-shaped antenna material 2m is partially die-cut, so the antenna material is preferably supplied intermittently, not together with the band-shaped label base material 9. In that case, because of intermittent supply, the antenna material 2m is temporarily cut from the continuum after die cutting. After die cutting, unnecessary sections are removed by suctioning.

Next as shown in FIG. 3(A), the electroconductive layer 6 and thermoadhesive resin layer 7 of the antenna material 2m are die-cut at fixed intervals from a side the electroconductive layer 6 is disposed by use of an antenna-cutting die 20 having a heat source 21. At this time, the electroconductive layer 6 and thermoadhesive resin layer 7 of the antenna material 2m are die-cut into a shape of the antenna pattern from the side the electroconductive layer 6 is disposed down to the non-release surface 8n of the band-shaped label base material 9. The heat source 21 of the antenna-cutting die 20 fuses the thermoadhesive resin layer 7 simultaneously with the above die-cutting operation, thus causing the antenna 2 to be bonded onto the non-release surface 8n of the band-shaped label base material 9. Sections of the die-cut antenna material 2m, the section excluding the antenna pattern, are in a continuous state and the continuous sections are removed using a separating roll (not shown) that is positioned at a post-processing stage. In the case where above-described intermittent supply of the antenna material is applied, the section exclusive of the antenna pattern can be removed from a flat-bed cutting die or a die-cutting roll by suctioning, without using a separating roll.

The antenna 2, although shown symbolically in block form in FIG. 3(A) to FIG. 3(D), has a detailed structure as shown in FIG. 1A and FIG. 1B. As shown in FIG. 3(A), the antenna can be die-cut using a planar flat-bed cutting die or a cutting die having a rotary cylinder surface.

Next as shown in FIG. 3(B), an IC chip 3 is mounted at a required position on the antenna 2. When the antenna 2 is of the dipole type, the IC chip 3 is mounted between left and right quarter-wavelength antenna portions 2L and 2R. When the antenna 2 is of a planar coil shape, the IC chip 3 is mounted across the coil. The IC chip 3 may be directly mounted as an independent component, or may be mounted as an interposer component. In the independent mounting, after a pad or bump of the IC chip and the antenna have been brought into firm contact with each other, periphery of the IC chip is fixed in that state using an anisotropic electroconductive paste, a tape, a non-electroconductive paste, or the like. Reliable connection can be established by using a stud-bumped chip as the IC chip 3 and inserting the bump into a metallic portion of the antenna 2 before fixing the periphery. For mounting as an interposer component, connection may use an electroconductive adhesive agent, a staking tool, or an ultrasonic connecting method in which metals of both the interposer and the antenna are to be molten for bonding.

Next as shown in FIG. 3 (C), a pressure-sensitive adhesive agent 5 is used to stack a surface protection sheet 4 upon the antenna 2, the IC chip 3, and the release surface 8 and non-release surface 8n of the band-shaped label base material 9. The pressure-sensitive adhesive agent 5 is of a type capable of maintaining an intermediate tacky state in which the adhesive agent can be used permanently without rapid and significant increases in viscosity. Since the antenna 2 is formed from a thin metallic foil, although temporarily bonded onto the band-shaped label base material 9 by a thermoadhesive resin layer 7, the antenna 2 tends to be easily damaged or destructed. When the surface protection sheet 4 is stacked via the pressure-sensitive adhesive layer 5, the antenna 2 is fixed to the surface of the band-shaped label base material 9 more strongly and protected.

After that, the surface protection sheet 4 and label base material 9 around the antenna 2 are punched into an outline shape of the noncontact IC tag label 1 by use of a label-cutting die 30, as shown in of FIG. 3(D). Alternatively, both ends of the surface protection sheet 4 and band-shaped label base material 9 each, that is, sections between labels adjacent to each other may be cut using a cutting machine. The cutting line or half-cutting line "c" is also formed in a process step simultaneous with or subsequent to the cutting operation. For cutting of the noncontact IC tag label 1 into a continuum, a perforation line or the like is provided between the adjacent labels.

A band-shaped label base material 9 with a partially and releasably surface-pretreated end is not used in the second manufacturing process. Instead, a release paper that has originally been releasably treated over its entire surface is used, in which case, a release agent is removed by polishing an antenna-forming section. The antenna 2 is thus processed. In the processing of the antenna, firstly the band-shaped label base material 9 with the release surface 8 formed thereupon is set up in place as shown in FIG. 6(A), and then a part of the band-shaped label base material 9 that becomes an antenna-forming section is polished to form the non-release surface 8n, as shown in FIG. 6(B). That is to say, in a process step preceding the manufacturing process step shown in FIG. 3(A), the release surface 8 may be polished by buffing, sandpaper rubbing, or the like, to form the non-release surface 8n of the band-shaped label base material 9, the non-release surface 8n corresponding to the antenna-forming section. Subsequent steps can be conducted similarly to those shown in FIG. 3(A) to FIG. 3(D).

A supplementary description of the above manufacturing method is given below. In the above manufacturing method, the antenna 2 is formed upon the non-release surface 8n of the band-shaped label base material 9 by die-cutting the electroconductive layer 6 including a metallic foil. During the formation of the antenna, however, the die-cut antenna section may not be smoothly separable from a section other than the antenna 2. If both sections become intertwined and entangled during the separation, electrical antenna disconnection will result. This tendency will be more significant as the antenna has a larger number of thin linear portions. Accordingly, a die-cutting cylinder of the following structure is preferably used.

FIG. 4 is a structural view of an antenna-punching apparatus. The die-cutting cylinder 20 is a metallic roller and has die-cutting teeth 18 formed, upon its peripheral face to fit the pattern of the antenna 2. The die-cutting teeth 18 for die-cutting the pattern of one antenna 2 are arranged in a plurality of sets around the cutting cylinder 20. The number of sets arranged, however, differs according to particular outline dimensions of the antenna and a particular diameter of the cutting cylinder. In addition, a receiving roller 17 is constructed of a metallic roller and a hard rubber roller. A gap between the receiving roller 17 and a cutting cylinder 16 can be adjusted to thickness of elements such as the band-shaped label base material 9, the metallic foil electroconductive layer 6, and/or the like, by, for example, changing the roller 17 in position. The cutting cylinder 20 can be a sculpturing roller, a rotary die, or the like.

A part of the continuum 10w including the band-shaped label base material 9 and electroconductive layer 6 (including the thermoadhesive resin layer 7) is pulled in between the cutting cylinder 20 and the receiving roller 17, and then the pattern of the antenna 2 is die-cut from above the electroconductive layer 6 by the die-cutting teeth 18. The die-cutting teeth 18 of the cutting cylinder 20 cut a portion of the electroconductive layer 6 and thermoadhesive resin layer 7, thus forming the antenna 2 easily and accurately. Thickness of the cutting teeth 18 is preadjusted to avoid cutting the layers of the band-shaped label base material 9.

In addition, such pattern cuts as shown in FIG. 1A and FIG. 1B are formed along a profile of the antenna 2 (i.e., outer edges at both sides of the antenna line) on the continuum 10*w* including the band-shaped label base material 9 and electroconductive layer 6, by distal ends of the die-cutting teeth which penetrates the continuum of the metallic foil electroconductive layer 6. Thus, the electroconductive layer 6 is accurately die-cut in accordance with the pattern of the antenna 2, truing up the profile of the antenna pattern properly.

Furthermore, an air hole 81 is formed between the individual die-cutting teeth 18 on an outer peripheral surface of the cutting cylinder 20 (the air hole 81 corresponding to unnecessary section of the electroconductive layer 6). These air holes 81 are each connected to a suction/discharge device 82. The suction/discharge device 82 is precisely controlled to ensure that in order for the die-cutting teeth 18 to cut the continuum 10*w*, the device 82 temporarily suctions unnecessary sections of the continuum 10*w* of the electroconductive layer 6 and thermoadhesive resin 7 by drawing in air towards the cutting die (in a direction of an arrow "a") via the air holes 81, then after the die cutting of the continuum 10*w* and very slight rotation of the cutting cylinder 20 through a required angle, blows the air out in a direction of an arrow "b" via the air holes 81 and discharges the temporarily suctioned unnecessary sections towards the continuum 10*w* of the band-shaped label base material 9.

Thus, the electroconductive layer 6 and thermoadhesive resin layer 7 is die-cut into the required pattern shape more reliably. In addition, reconnection between an unnecessary section and a necessary one after die cutting can be avoided, and the unnecessary sections of the continuum 10*w* can be recovered easily. Furthermore, the unnecessary portions can be prevented from becoming congested between adjacent die-cutting teeth 18 on the outer peripheral surface of the cutting cylinder 20. The air holes 81 may be selectably connected to an air suction mechanism and discharge mechanism of the suction/discharge device 82, or air holes for connection to the suction mechanism may be provided independently of air holes for connection to the discharge mechanism. To persons skilled in the art, it is self-evident that in flat-bed die cutting, although this is not shown, unnecessary sections can be easily removed by providing air holes similarly to the above and leaving the necessary sections of the die-cut antenna 2 intact on the band-shaped label base material 9.

At a downstream side relative to the cutting cylinder 20, the antenna-punching apparatus has separating rollers 20*a* and 20*b* above and below the continuum 10*w*. Upon a passage of a part of the continuum 10*w* between the separating rollers 20*a* and 20*b*, the necessary section and unnecessary section of the continuum are pulled in different directions. The antenna 2 supported upon the surface of the band-shaped label base material 9 travels in this state in an arrow-marked direction (downward in FIG. 4), and the unnecessary section 2*w* that has been die-cut by the cutting cylinder 20 travels in a different arrow-marked direction (upward in FIG. 4) while being completely separated from the continuum 10*w*. After that, the IC chip 3 and other necessary members are mounted on the antenna 2, and the surface protection sheet 4 is laminated. The section of the electroconductive layer 6 that serves as the antenna 2 has a very small area, so the unnecessary section 2*w* is removed as a continuum that, as a matter of fact, has a larger area. For intermittent supply of the antenna material 2*m*, the continuum 10*w* is temporarily cut during die cutting. The antenna material 2*m* is therefore discontinuous at the separating rollers 20*a*, 20*b*, in which case, the separating rollers 20*a*, 20*b* remove unnecessary sections by suctioning.

FIG. 5 is a diagram illustrating an example of an interposer. FIG. 5(A) is a plan view of the interposer, FIG. 5(B) is a cross-sectional view, and FIG. 5(C) is a layout view of the interposer as mounted on the antenna 2. The interposer 3*i* is created by forming metallic-foil electroconductive layer-based connection terminals 3*a* and 3*b* upon a face of a base material 31, for example, and mounting an IC chip 3 between the connection terminals 3*a* and 3*b*. The IC chip 3 is electrically connected at its bump to the connection terminals 3*a*, 3*b* via an electroconductive adhesive agent or the like, as shown in FIG. 5(B). Actual base-material width of the interposer 3*i* is about two to three millimeters, and length thereof is about several millimeters. However, the interposer, unlike that shown in FIG. 5, is variable in shape and dimensions partly because the interposer may also be of a bridge structure with a connection across the antenna line. For mounting of the interposer 3*i* on the antenna 2, the connection terminals 3*a* and 3*b* are interconnected at sections marked "x" in FIG. 5(C), by bringing the terminals 3*a* and 3*b* into contact with the antenna 2 and then forcibly inserting the interposer from an opposite face of the base material 31 (i.e., in a direction of arrows y1 and y2) using a staking edge. Such a technique is also described in JP-2006-107418A, an earlier application of the applicant. Ultrasonic mounting may be adopted as an alternative method. After the mounting of the IC chip 3, a surface protection sheet 4 is stacked by bonding, as shown in FIG. 5(C).

Embodiments Relating to the Kind of Material (1) Adhesive Agent and Pressure-Sensitive Adhesive Agent The terms "adhesives" or "adhesive agents" used in the present DESCRIPTION refer to solvent types, polymer types, ultraviolet-radiation curing types, emulsion types, heat-melting types, and various other types, inclusive of so-called pressure-sensitive adhesive agent types. This is because any one of these types of adhesive agents makes an intended purpose of the adhesive agent attainable just by bonding both the label material and its intended object material. In addition, the terms "pressure-sensitive adhesives" or "pressure-sensitive adhesive agents" used in the present DESCRIPTION refer to types including the type that permanently maintains the intermediate tacky state of the adhesive agent without gradual and significant increases in viscosity. Resin compositions of the above adhesives and pressure-sensitive adhesives can include various kinds of materials such as those based on natural rubber, nitrile rubber, epoxy resin, vinyl acetate emulsion, polyester, acryl, ester acrylate copolymer, polyvinyl alcohol, and phenol resin.

(2) Release Paper

A base material coated with a chemical (usually, silicone) of a low contact angle to achieve low peel strength is used for a release paper. High-quality paper, kraft paper, glassine paper, parchment paper, super-calendered paper, or the like is used as a release paper base material. The release paper is usually provided with direct silicone coating or with silicone coating after either polyethylene coating or clay binder coating. PET, OPP (biaxially stretched polypropylene), or PE is also used directly intact or in silicone-coated form as a release paper base material.

First Example

An aluminum foil with 40 mm wide by 15 μm thick, coated with a polyester-based hot-melting adhesive agent (thermoadhesive resin layer 7) to a thickness of 25 μm, is used as a continuum of an antenna material 2m. Kraft paper with a width of 40 mm and a thickness of 100 μm is used as a band-shaped label base material 9. The kraft paper is releasably pretreated by silicone coating to ensure a length L of 300 mm of each label 1 and obtain a release surface 8 that has an end-to-end length of 50 mm for the unit length of 300 mm.

The antenna material 2m is supplied intermittently to be positioned above the band-shaped label base material 9, then at an antenna die-cutting position, the antenna material 2m is stacked such that the band-shaped label base material 9 and the antenna material 2m come into firm contact with each other, and a dipole antenna 2 having the shape shown in FIG. 1A and FIG. 1B is continuously punched at 300-mm intervals using a test-produced flat-bed antenna-cutting die 20 containing a heat source. After one punching operation, the antenna material 2m is temporarily cut. The cutting die 20 is a device having the foregoing air holes 81 and constructed to connect to a suction/discharge device 82. The heat source is also inserted within a receiving die side of the cutting die so that the thermoadhesive resin layer 7 is fully heated and fused.

Upon suctioning removal of unnecessary sections from the die-cut antenna material 2m, necessary sections of the antenna 2 are separated from the unnecessary sections smoothly to obtain a precise antenna pattern shape in a thermally transferred condition on the surface of the band-shaped label base material 9. A UHS-band IC chip 3 ("Monza", manufactured by Impinj, Inc., USA) is mounted between connections 2a and 2b on antenna portions 2L and 2R by use of an anisotropic electroconductive adhesive agent. After this, upper faces of the antenna 2 and IC chip 3 are laminated with a PET film 30 mm wide and 20 μm thick, via a pressure-sensitive adhesive layer 5 with a thickness of 30 μm. A surface protection sheet 4 is thus obtained. Finally, a perforations cutting line is formed at a unit length of 300 mm and a cutting line "c" is provided at a distance of 45 mm from both ends of the band-shaped label base material 9 of each noncontact IC tag label 1. The noncontact IC tag label 1 of the present invention is thus completed.

Second Example

An aluminum foil with 110 mm wide by 15 μm thick, coated with a polyester-based hot-melting adhesive agent (thermoadhesive resin layer 7) to a thickness of 25 μm, is used as a continuum of an antenna material 2m. Kraft paper coated with silicone over its entire surface to a width of 300 mm and a thickness of 80 μm is used as a band-shaped label base material 9. This release paper's section to which an antenna 2 is to be thermally transferred is previously treated to remove a release layer 8 by continuous buffing in 110-mm wide band form.

The antenna material 2m is overlaid in a firm contact condition upon the band-shaped label base material 9, and then supplied to the flat-bed antenna-cutting die 20 used in the first example. A dipole antenna 2 having the shape shown in FIG. 1A and FIG. 1B is continuously die-cut at 40-mm intervals. A part of the continuum 10w of the die-cut antenna material 2m is moved past between separating rollers 20a and 20b, then necessary sections of the antenna 2 are separated from unnecessary sections, and a precise antenna pattern shape is obtained in a thermally transferred condition on the surface of the band-shaped label base material 9. As shown in FIG. 5, a UHS-band IC chip 3 ("Monza", manufactured by Impinj, Inc., USA) is mounted in interposer form between connections 2a and 2b on antenna portions 2L and 2R by use of a staking tool.

After that, upper faces of the antenna 2 and IC chip 3 are laminated with 300-mm wide and black-color developing heat-sensitive paper (manufactured by Ricoh Co., Ltd.) via a 30-μm thick pressure-sensitive adhesive layer 5. Thus, a surface protection sheet 4 is obtained. Finally, the continuum 10w is punched by using a label-cutting die 30 to obtain IC tag labels each measuring 36 mm wide by 280 mm long. A continuum of the airline baggage tag label 1 of the present invention is thus completed. A cutting line c is provided at a distance of 45 mm from both ends of the airline baggage tag label 1.

The noncontact IC tag label 1 in the first example and the airline baggage tab label 1 in the second examples were tested using a UHF-band label reader/writer to confirm that normal reading from/writing onto both is achievable. It is also confirmed that the airline baggage tag label 1 in the second example allows printing/recording on the surface protection sheet 4 by a thermal head.

The invention claimed is:

1. A noncontact IC tag label, comprising:
    a band-shaped label base material that includes a release surface formed at least at one end of the base material, the release surface being releasably pretreated, and a non-release surface;
    an electroconductive layer formed on the non-release surface of the band-shaped label base material, the electroconductive layer including a required antenna pattern;
    an IC chip mounted on one face of the electroconductive layer; and
    a surface protection sheet for shrouding the electroconductive layer and the IC chip via a pressure-sensitive adhesive layer, wherein
    a thermoadhesive resin layer bonded onto the non-release surface of the band-shaped label base material is provided on an opposite face of the electroconductive layer including the antenna pattern, with respect to the surface protection sheet,
    both the thermoadhesive resin layer and the electroconductive layer are formed to have substantially the same shape as that of the antenna pattern, and
    the pressure-sensitive adhesive layer provided on the surface protection sheet is bonded onto the non-release surface and the release surface of the band-shaped label base material.

2. The noncontact IC tag label according to claim 1, wherein
    a cutting line or half-cutting line for zoning the band-shaped label base material into a section inclusive of the non-release surface and a section inclusive of the release surface of the band-shaped label base material, is formed at one end of the band-shaped label base material, and
    the section of the band-shaped label base material, the section including the release surface, is constructed to be detachable and removable from the section inclusive of the non-release surface.

3. The noncontact IC tag label according to claim 1, wherein
    the surface protection sheet is formed from heat-sensitive color-developing paper.

4. The noncontact IC tag label according to claim 1, wherein
the antenna pattern is of either a spiral coil type, a dipole type, or a patch type.

5. An airline baggage tag label, comprising:
a band-shaped label base material that includes a release surface formed at least at one end of the base material, the release surface being releasably pretreated, and a non-release surface;
an electroconductive layer formed on the non-release surface of the band-shaped label base material, the electroconductive layer including a UHF-band or 2.45-GHz-band dipole antenna;
an IC chip mounted on one face of the electroconductive layer; and
a surface protection sheet for shrouding the electroconductive layer and the IC chip via a pressure-sensitive adhesive layer, wherein
a thermoadhesive resin layer bonded onto the non-release surface of the band-shaped label base material is provided on an opposite face of the electroconductive layer including the antenna pattern, with respect to the surface protection sheet,
both the thermoadhesive resin layer and the electroconductive layer are formed to have substantially the same shape as that of the antenna pattern, and
the pressure-sensitive adhesive layer provided on the surface protection sheet is bonded onto the non-release surface and the release surface of the band-shaped label base material.

6. The airline baggage tag label according to claim 5, wherein
a cutting line or half-cutting line for zoning the band-shaped label base material into a section inclusive of the non-release surface and a section inclusive of the release surface, is formed at one end of the band-shaped label base material, and
the section of the band-shaped label base material, the section including the non-release surface, is constructed to be detachable and removable from the section inclusive of the release surface.

7. A method for manufacturing a noncontact IC tag label, the method comprising the steps of:
setting up into position a band-shaped label base material that includes a release surface formed at least at one end of the base material, the release surface being releasably pretreated, and a non-release surface;
bringing an antenna material inclusive of an electroconductive layer and a thermoadhesive resin layer into firm contact with the non-release surface of the band-shaped label base material such that the thermoadhesive resin layer comes into contact with the non-release surface;
die-cutting the electroconductive layer and thermoadhesive resin layer of the antenna material into a shape of an antenna pattern, from a side the electroconductive layer is disposed down to the non-release surface, by means of an antenna-cutting die with a heat source, so that both the thermoadhesive resin layer and the electroconductive layer are formed to have substantially the same shape as that of the antenna pattern, while at the same time, bonding the thermoadhesive resin layer onto the non-release surface by fusing the thermoadhesive resin layer;
removing a section of the die-cut antenna material, the section excluding the antenna pattern;
mounting an IC chip at a required position on the antenna pattern; and
stacking a surface protection sheet over the antenna pattern, the IC chip, and the non-release surface and release surface of the band-shaped label base material, via a pressure-sensitive adhesive agent.

8. A method for manufacturing a noncontact IC tag label, the method comprising the steps of:
setting up into position a band-shaped label base material including a releasably treated release surface;
forming a non-release surface by polishing a part of the band-shaped label base material, the part becoming an antenna-forming section;
bringing an antenna material inclusive of an electroconductive layer and a thermoadhesive resin layer into firm contact with the non-release surface formed in the polishing step, in order for the thermoadhesive resin layer to come into contact with the non-release surface;
die-cutting the electroconductive layer and thermoadhesive resin layer of the antenna material into a shape of an antenna pattern, from a side the electroconductive layer is disposed down to the non-release surface, by means of an antenna-cutting die with a heat source, so that both the thermoadhesive resin layer and the electroconductive layer are formed to have substantially the same shape as that of the antenna pattern, while at the same time, bonding the thermoadhesive resin layer onto the non-release surface by fusing the thermoadhesive resin layer;
removing a section of the die-cut antenna material, the section excluding the antenna pattern;
mounting an IC chip at a required position on the antenna pattern; and
stacking a surface protection sheet over the antenna pattern, the IC chip, and the non-release surface and release surface of the band-shaped label base material, via a pressure-sensitive adhesive agent.

9. The method for manufacturing a noncontact IC tag label according to claim 7, wherein the antenna pattern is formed for adaptation to either a spiral coil type, a dipole type, or a patch type.

10. The method for manufacturing a noncontact IC tag label according to claim 7, wherein the surface protection sheet is formed from heat-sensitive color-developing paper.

11. The method for manufacturing a noncontact IC tag label according to claim 8, wherein the antenna pattern is formed for adaptation to either a spiral coil type, a dipole type, or a patch type.

12. The method for manufacturing a noncontact IC tag label according to claim 8, wherein the surface protection sheet is formed from heat-sensitive color-developing paper.

* * * * *